(12) United States Patent
Yamada et al.

(10) Patent No.: US 9,373,900 B2
(45) Date of Patent: Jun. 21, 2016

(54) CONTACT STRUCTURE UNIT

(75) Inventors: Yoshio Yamada, Nagano (JP); Osamu Ito, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 36 days.

(21) Appl. No.: 14/233,484

(22) PCT Filed: Jul. 17, 2012

(86) PCT No.: PCT/JP2012/068112
§ 371 (c)(1),
(2), (4) Date: Jan. 17, 2014

(87) PCT Pub. No.: WO2013/011985
PCT Pub. Date: Jan. 24, 2013

(65) Prior Publication Data
US 2014/0162503 A1   Jun. 12, 2014

(30) Foreign Application Priority Data
Jul. 19, 2011   (JP) .................................. 2011-158446

(51) Int. Cl.
*H01R 12/00* (2006.01)
*H01R 4/48* (2006.01)
(Continued)

(52) U.S. Cl.
CPC .......... *H01R 4/4863* (2013.01); *G01R 1/06722* (2013.01); *G01R 1/06733* (2013.01); *G01R 1/07314* (2013.01)

(58) Field of Classification Search
CPC ........... H01R 13/2421; H01R 13/2414; H01R 13/2435

USPC ............................................ 439/66, 700, 824
See application file for complete search history.

(56) References Cited

U.S. PATENT DOCUMENTS 6,462,567 B1 * 10/2002 Vinther .............. G01R 1/06722
324/754.14
6,503,089 B2 * 1/2003 Saijo ...................... G01R 1/045
439/70

(Continued)

FOREIGN PATENT DOCUMENTS

JP   63-25372 U    2/1988
JP   10-253661 A   9/1998
(Continued)

OTHER PUBLICATIONS

Office Action dated Nov. 17, 2014, issued in corresponding Taiwanese Patent Application No. 101125984.
(Continued)

*Primary Examiner* — Hien Vu
(74) *Attorney, Agent, or Firm* — Lock Lorde LLP

(57) ABSTRACT

A contact structure unit that achieves electrical continuity between a substrate, which includes a plurality of electrodes, and a contact object includes a first-type contact-carrying member including a contact portion which makes contact with the contact object; includes a plurality of second-type contact-carrying members each of which includes a leading end portion formed at one end portion and making contact with the electrodes and each of which makes contact with the first-type contact-carrying member at the other end portion; and includes a plurality of coil springs each of which is disposed between the contact portion and the leading end portions and each of which biases the contact portion and the leading end portions.

4 Claims, 10 Drawing Sheets

(51) Int. Cl.
*G01R 1/067* (2006.01)
*G01R 1/073* (2006.01)

(56) References Cited

U.S. PATENT DOCUMENTS

| | | | |
|---|---|---|---|
| 6,937,045 B2 | 8/2005 | Sinclair | |
| 7,256,593 B2* | 8/2007 | Treibergs | G01R 1/0466 324/754.05 |
| 7,545,159 B2* | 6/2009 | Winter | G01R 1/06733 324/755.05 |
| 7,946,855 B2* | 5/2011 | Osato | H05K 7/1069 324/755.05 |
| 8,087,956 B2* | 1/2012 | Nakayama | G01R 1/045 439/700 |
| 2006/0279301 A1 | 12/2006 | Treibergs | |

FOREIGN PATENT DOCUMENTS

| | | |
|---|---|---|
| JP | 2003-234161 A | 8/2003 |
| JP | 2005-166312 A | 6/2005 |
| JP | 2007-322136 A | 12/2007 |
| JP | 2008-096368 A | 4/2008 |
| JP | 2008-157681 A | 7/2008 |
| JP | 2008-546164 A | 12/2008 |
| JP | 2009-074963 A | 4/2009 |
| WO | WO-2010/007816 A1 | 1/2010 |
| WO | WO-2011/036800 A1 | 3/2011 |

OTHER PUBLICATIONS

International Search Report dated Oct. 16, 2012, issued for PCT/JP2012/068112.
Office Action mailed Dec. 22, 2015, issued for the Japanese Patent Application No. 2013-524725 and English translation thereof.

* cited by examiner

CONTACT STRUCTURE UNIT

FIELD

The present invention relates to a contact structure unit that is used while performing conduction state inspection or operating characteristics inspection of a target for inspection such as a semiconductor integrated circuit or a liquid crystal panel.

BACKGROUND

Typically, while performing conduction state inspection or operating characteristics inspection of a target for inspection such as a semiconductor integrated circuit or a liquid crystal panel, a contact structure unit is used that includes a plurality of contact-carrying members for establishing electrical connection between the target for inspection and a signal processing device which outputs signals for inspection. In such a contact structure unit, with the recent progress in achieving a high degree of integration and downsizing of semiconductor integrated circuits and liquid crystal panels, there has been advancement in the technology by which the pitch of contact-carrying members is narrowed so as to be able to deal with a target for inspection having a high degree of integration and downsizing.

Exemplary techniques for performing conduction state inspection or operating characteristics inspection of a target for inspection, such as a semiconductor integrated circuit or a liquid crystal panel, include the four-terminal measurement technique. As far as the four-terminal measurement technique is concerned, a method is disclosed for manufacturing a contact structure unit in which a pair of contact-carrying members (contact probes), which form a contact structure held on a guide plate, have the leading ends thereof making contact with a target for contact (a measurement object) with the aim of measuring the electrical characteristics (for example, see Patent Literature 1).

Regarding the pair of contact-carrying members disclosed in Patent Literature 1, one end of each contact-carrying members makes contact with a lead and the other end makes contact with the target for contact. Herein, since the contact-carrying members in a single pair simultaneously make contact with the target for contact, four-terminal measurement is performed. According to Patent Literature 1, if the contact-carrying members in a single pair have different diameters in a direction perpendicular to the direction of inserting them in the guide plate, then the contact-carrying members can be arranged in an efficient manner.

CITATION LIST

Patent Literature

Patent Literature 1: Japan Patent Application Laid-open No. 2009-74963

SUMMARY

Technical Problem

Meanwhile, a target for contact has various shapes such as a hemispherical shape, a spindle shape, and a plate-like shape. If the target for contact has a hemispherical shape and if the four-terminal measurement technique is implemented using the contact structure disclosed in Patent Literature 1; then, when the two contact-carrying members simultaneously make contact with the target for contact, at least one of the contact-carrying members makes contact at a position away from the center of the hemispherical shape. For that reason, there are times when a contact-carrying member slips off the surface of the target for contact and thus falls off the target for contact. In case a contact-carrying member falls off the target for contact, then it may not be possible to achieve reliable electrical continuity with the target for contact.

The present invention has been made in view of the above-mentioned issues, and it is an object to provide a contact structure unit that enables achieving reliable electrical continuity with a target for contact.

Solution to Problem

To solve the problem described above and achieve the object, a contact structure unit according to the present invention that achieves electrical continuity between a substrate, which includes a plurality of electrodes, and a contact object includes: a first-type contact-carrying member that includes a first-type contact portion which makes contact with the contact object; a plurality of second-type contact-carrying members each of which includes a second-type contact portion formed at one end portion and making contact with the electrodes and each of which makes contact with the first-type contact-carrying member at other end portion; and a plurality of coil springs each of which is disposed between the first-type contact portion and each of the second-type contact portions and each of which biases the first contact portion and the second-type contact portions.

Moreover, in the contact structure unit according to the present invention as set forth in the invention described above, each of the second-type contact-carrying member includes an electrically-conductive first plunger that has a tapering leading end and that has a leading end portion making contact with the first-type contact-carrying member; and an electrically-conductive second plunger that includes the second-type contact portion, and the coil springs link the first plunger and the second plunger.

Moreover, in the contact structure unit according to the present invention as set forth in the invention described above, the leading end portion includes a plurality of claws.

Moreover, in the contact structure unit according to the present invention as set forth in the invention described above, the first-type contact-carrying member has an elastically-deformable sheet-like shape and has the first-type contact portion formed in plurality on one face, and the first-type contact-carrying member includes a third-type contact portion that makes contact with the second-type contact-carrying member at a position corresponding to the first-type contact portion on other face.

Moreover, in the contact structure unit according to the present invention as set forth in the invention described above, the first-type contact-carrying member has a plate-like shape, and includes a flange portion, which is disposed at a base end side of the first-type contact portion and which has a greater width than the first-type contact portion, and includes two first-type base end portions, which extend from an end portion of the flange portion which is different than the side linked to the first-type contact portion and which are inserted in the inner peripheral side of the coil springs, the second-type contact-carrying member has a plate-like shape, and includes a second-type base end portion that extends from the base end side of the first-type contact portion and that is inserted on the inner peripheral side of the coil springs and makes contact with the first-type base end portion, and the coil springs constrain the first-type base end portion and the second-type base end portion in a slidable manner.

Moreover, in the contact structure unit according to the present invention as set forth in the invention described above, two of the first-type contact-carrying member are present, and two of the first-type base end portion sandwich the second-type base end portion.

Moreover, in the contact structure unit according to the present invention as set forth in the invention described above, the first-type contact portion includes a plurality of claws.

Advantageous Effects of Invention

In a contact structure unit according to the present invention, while performing four-terminal measurement, a first-type contact-carrying member, which makes contact with a plurality of second-type contact-carrying members connected to different electrodes, makes contact with a target electrode for contact. As a result, it becomes possible to achieve reliable electrical continuity with the target for contact.

DESCRIPTION OF EMBODIMENTS

Figure 1:
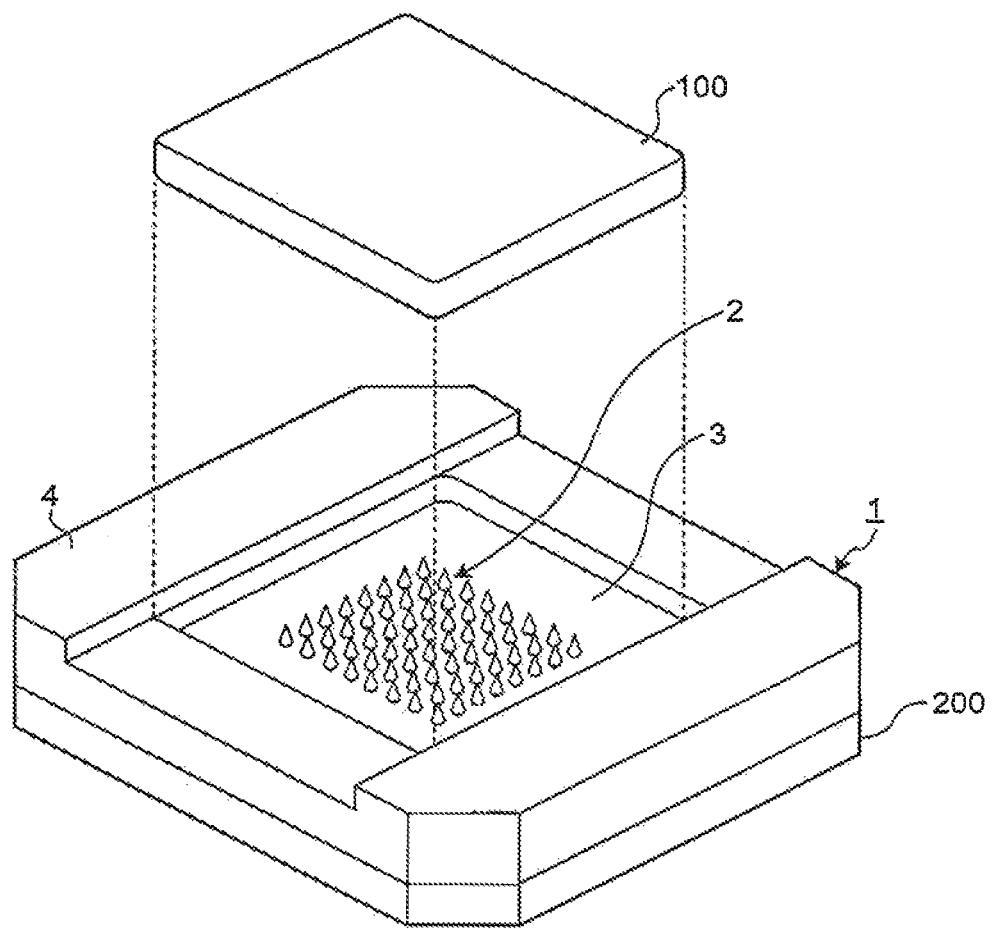
FIG. 1 is a perspective view illustrating a configuration of a contact structure unit according to a first embodiment of the present invention.

Exemplary embodiments of the present invention are described below in detail with reference to the accompanying drawings. However, the present invention is not limited to the embodiments described below. Moreover, the drawings that are referred to in the following explanation merely schematically illustrate the shapes, the sizes, and the positional relationships that enable having an understanding of the contents of the present invention. That is to say, the present invention is not limited to the shapes, the sizes, and the positional relationships illustrated in the drawings.

(First Embodiment)

FIG. 1 is a perspective view illustrating a configuration of a contact structure unit according to a first embodiment of the present invention. A contact structure unit 1 illustrated in FIG. 1 is a device used while performing electric characteristics inspection of a semiconductor integrated circuit 100 that serves as the target for inspection, and is a device that electrically connects the semiconductor integrated circuit 100 to a circuit substrate 200 that outputs signals for inspection to the semiconductor integrated circuit 100.

The contact structure unit 1 includes contact structures 2 that are electrically-conductive in nature and that, at both ends thereof in the longitudinal direction, make contact with the semiconductor integrated circuit 100 and the circuit substrate 200; includes a contact structure holder 3 that houses and holds a plurality of contact structures 2 according to a predetermined pattern; and includes a holder member 4 that is disposed around the contact structure holder 3 and that, at the time of inspection, prevents misalignment of the semiconductor integrated circuit 100 making contact with the plurality of the contact structures 2.

Figure 2:
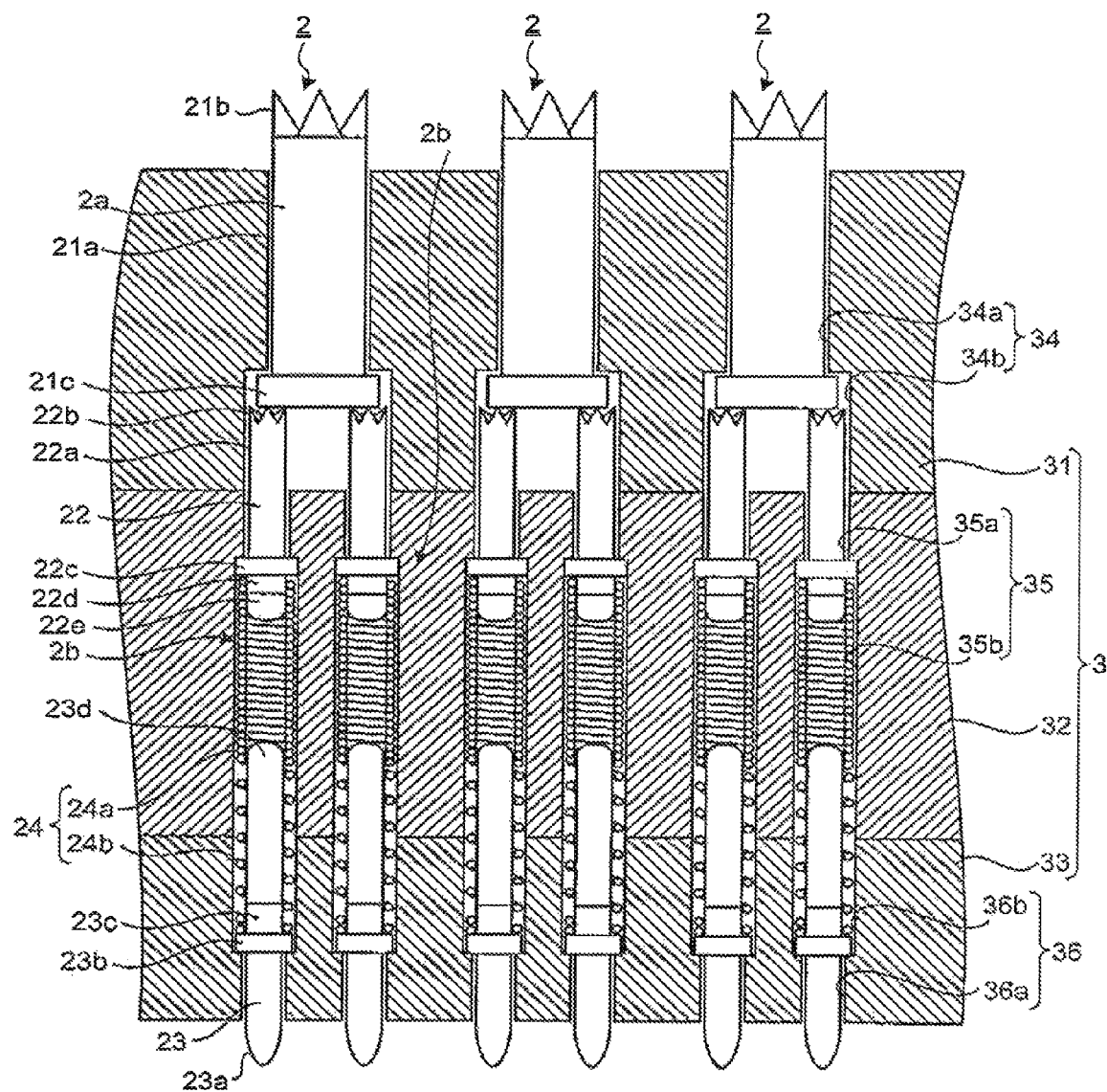
FIG. 2 is a partial cross-sectional diagram illustrating a configuration of the main portion of the contact structure unit according to the first embodiment of the present invention.

FIG. 2 is a diagram illustrating a detailed configuration of the contact structures 2 housed in the contact structure holder 3. The contact structures 2 illustrated in FIG. 2 are formed using an electrically-conductive material. Each contact structure 2 includes a first-type contact-carrying member 2a that, at the time of performing inspection of the semiconductor integrated circuit 100, makes contact with a connection electrode (a contact object) of the semiconductor integrated circuit 100; includes two second-type contact-carrying members 2b that are arranged along the longitudinal direction of the contact structure 2 and in parallel to the first-type contact-carrying member 2a and that make contact with electrodes of the circuit substrate 200 that is equipped with an inspection circuit; and includes two coil springs 24 that are biasable toward the leading ends of the first-type contact-carrying member 2a and the second-type contact-carrying members 2b.

Each first-type contact-carrying member 2a has a tapering leading end; and includes, in a coaxial manner, a contact portion 21a (a first-type contact portion), which includes a plurality of claws 21b, and a flange portion 21c, which extends from the base end of the contact portion 21a and which has a greater diameter as compared to the diameter of the contact portion 21a.

Each second-type contact-carrying member 2b includes first plungers 22 that make contact with the flange portion 21c; includes second plungers 23 that make contact with the electrodes of the circuit substrate 200 which is equipped with an inspection circuit; and includes the coil springs 24 that are disposed in between the first plungers 22 and the second plungers 23 and that telescopically couple the first plungers 22 to the second plungers 23. The first plunger 22, the second plunger 23, and the coil spring 24 constituting each second-type contact-carrying member 2b have the same axis line.

Moreover, in each contact structure 2, the axis of the first-type contact-carrying member 2a and the axis of the second-type contact-carrying member 2b are parallel to each other.

Each first plunger 22 has the plurality of the claws 22b with tapering leading ends. Moreover, each first plunger 22 includes, in a coaxial manner, a leading end portion 22a (a leading end portion) that makes contact with the flange portion 21c of the first-type contact-carrying member 2a with the claws 22b; includes a flange portion 22c that extends from the base end side of the leading end portion 22a and that has a greater diameter as compared to the diameter of the leading end portion 22a; includes a boss portion 22d that extends from the end portion of the flange portion 22c which is different than the side continuing into the leading end portion 22a and that has a smaller diameter as compared to the diameter of the flange portion 22c; and includes a base end portion 22e that extends from the end portion of the boss portion 22d which is different than the side linked to the flange portion 22c and that has a substantially identical diameter to the diameter of the boss portion 22d. The leading end of the base end portion 22e has a shape formed by round chamfering.

Each second plunger 23 has a tapering leading end, and includes, in a coaxial manner, a leading end portion 23a that makes contact with an electrode of the circuit substrate 200; includes a flange portion 23b that extends from the base end side of the leading end portion 23a and that has a greater diameter as compared to the diameter of the leading end portion 23a; includes a boss portion 23c that extends from the end portion of the flange portion 23b which is different than the side continuing into the leading end portion 23a and that has a substantially identically diameter to the diameter of the boss portions 22d; and includes a base end portion 23d that extends from the end portion of the boss portion 23c which is different than the side linked to the flange portion 23b and that has a substantially identical diameter to the diameters of the boss portions 22d and 23c. Meanwhile, the leading end portion 23a and the flange portion 23b represent a second-type contact-carrying portion. Moreover, the leading end of the base end portion 23d has a shape formed by round chamfering. The second plungers 23 are movable in the direction of axis due to the elongation and compression of the coil springs 24; are biased in the direction of the circuit substrate 200 due to the elastic force of the coil springs 24; and make contact with the electrodes of the circuit substrate 200.

When the contact structures 2 make contact with the semiconductor integrated circuit 100, the coil springs 24 elongate and compress in the direction of axis so as to cushion the impact of the semiconductor integrated circuit 100 against the connection electrodes as well as to apply load on the semiconductor integrated circuit 100 and the circuit substrate 200.

In each coil spring 24, the side toward the first plunger 22 has a tightly-wound portion 24a that is wound with an inner diameter that is substantially identical to the diameter of the boss portion 22d; and the side toward the second plunger 23 has a roughly-wound portion 24b that is wound with an inner diameter equal to or greater than the diameters of the boss portion 23c and the base end portion 23d and at a predetermined pitch. When the end portion of the tightly-wound portion 24a has, for example, a substantially identical inner diameter to the diameter of the boss portion 22d; the end portion of the tightly-wound portion 24a is press-fit in the boss portion 22d and abuts against the flange portion 22c. On the other hand, the end portion of the roughly-wound portion 24b is press-fit in the boss portion 23c and abuts against the flange portion 23b. Meanwhile, in each coil spring 24, it is desirable that the tightly-wound portion 24a and the roughly-wound portion 24b are wound at the same inner diameter.

Herein, the first plunger 22, the second plunger 23, and the coil spring 24 can be joined by means of soldering.

The wire rod used in each coil spring 24 is made of an electrically-conductive metal which has a spring characteristic (stroke) that, for example, when an initial load is applied, the amount of compression of the roughly-wound portion 24b in response to the application of a predetermined load is greater than the shortest distance between the base end portion 23d and the tightly-wound portion 24a in the condition in which the contact structure 2 is housed in the contact structure holder 3 (see FIG. 1). As a result of using the coil springs 24 having such a spring characteristic, when a predetermined load is applied to the contact structure 2, the base end portion 23d can make sliding contact inside the tightly-wound portion 24a and electrical continuity can be achieved between the base end portion 23d and the tightly-wound portion 24a.

The contact structure holder 3 is formed using an insulating material such as resin, machinable ceramics, or silicon; and is made by laminating a first member 31, a second member 32, and a third member 33 starting from the side of the top surface with reference to FIG. 2. In the first member 31, the second member 32, and the third member 33 are formed holder holes 34, 35, and 36, respectively, corresponding to a plurality of contact structures 2 for the purpose of housing and holding the contact structures 2. The holder holes 34, 35, and 36 that house the contact structures 2 are formed to have mutually parallel axis lines. Moreover, the positions of forming the holder holes 34, 35, and 36 are determined according to the wiring pattern of the semiconductor integrated circuit 100.

The holder hole 34 includes a small diameter portion 34a having an opening at the top end face of the contact structure holder 3 and includes a large diameter portion 34b having a greater diameter as compared to the diameter of the small diameter portion 34a. Moreover, the small diameter portion 34a has a smaller diameter as compared to the diameter of the large diameter portion 34b but has a slightly greater diameter as compared to the diameter of the contact portion 21a. The large diameter portion 34b has a slightly greater diameter as compared to the flange portion 21c. Herein, the flange portion 21c of the first-type contact-carrying member 2a abuts against the boundary wall surface between the small diameter portion 34a and the large diameter portion 34b of the holder hole 34, and thus has a function of preventing the first-type contact-carrying member 2a from coming off from the contact structure holder 3.

Each of the holder holes 35 and 36 is formed in a connected manner to the holder hole 34, and has the shape of a stepped hole having different diameters in the direction of penetration. That is, the holder hole 35 includes a small diameter portion 35a having an opening at the top end face of the side of the second member 32 that abuts against the first member 31, and includes a large diameter portion 35b having a greater diameter as compared to the diameter of the small diameter portion 35a. Moreover, the small diameter portion 35a has a slightly greater diameter as compared to the diameter of the leading end portion 22a. The large diameter portion 35b has a slightly greater diameter as compared to the diameter of the flange portion 22c and/or the coil spring 24.

The holder hole includes a small diameter portion 36a having an opening at the bottom end face of the contact structure holder 3 and includes a large diameter portion 36b having a greater diameter as compared to the diameter of the small diameter portion 36a. Herein, the small diameter portion 36a has a slightly greater diameter as compared to the leading end portion 23a. The large diameter portion 36b has a slightly greater diameter as compared to the diameter of the flange portion 23b and/or the coil spring 24. The shapes of the holder holes 35 and 36 are determined according to the configuration of a second-type contact-carrying member 2b in which the holder holes 35 and 36 are formed.

The flange portion 22c of the first plunger 22 abuts against the boundary wall surface between the small diameter portion 35a and the large diameter portion 35b of the holder hole 35, and thus has a function of preventing the second-type contact-carrying member 2b from coming off from the contact structure holder 3. Similarly, the flange portion 23b of the second plunger 23 abuts against the boundary wall surface between the small diameter portion 36a and the large diameter portion 36b of the holder hole 36, and thus has a function of preventing the second-type contact-carrying member 2b from coming off from the contact structure holder 3. Herein, the boundary wall surfaces of the holder holes 35 and 36 can have a step-like shape in accordance with the diameters of the flange portions 22c and 23b or the coil spring 24.

Figure 3:
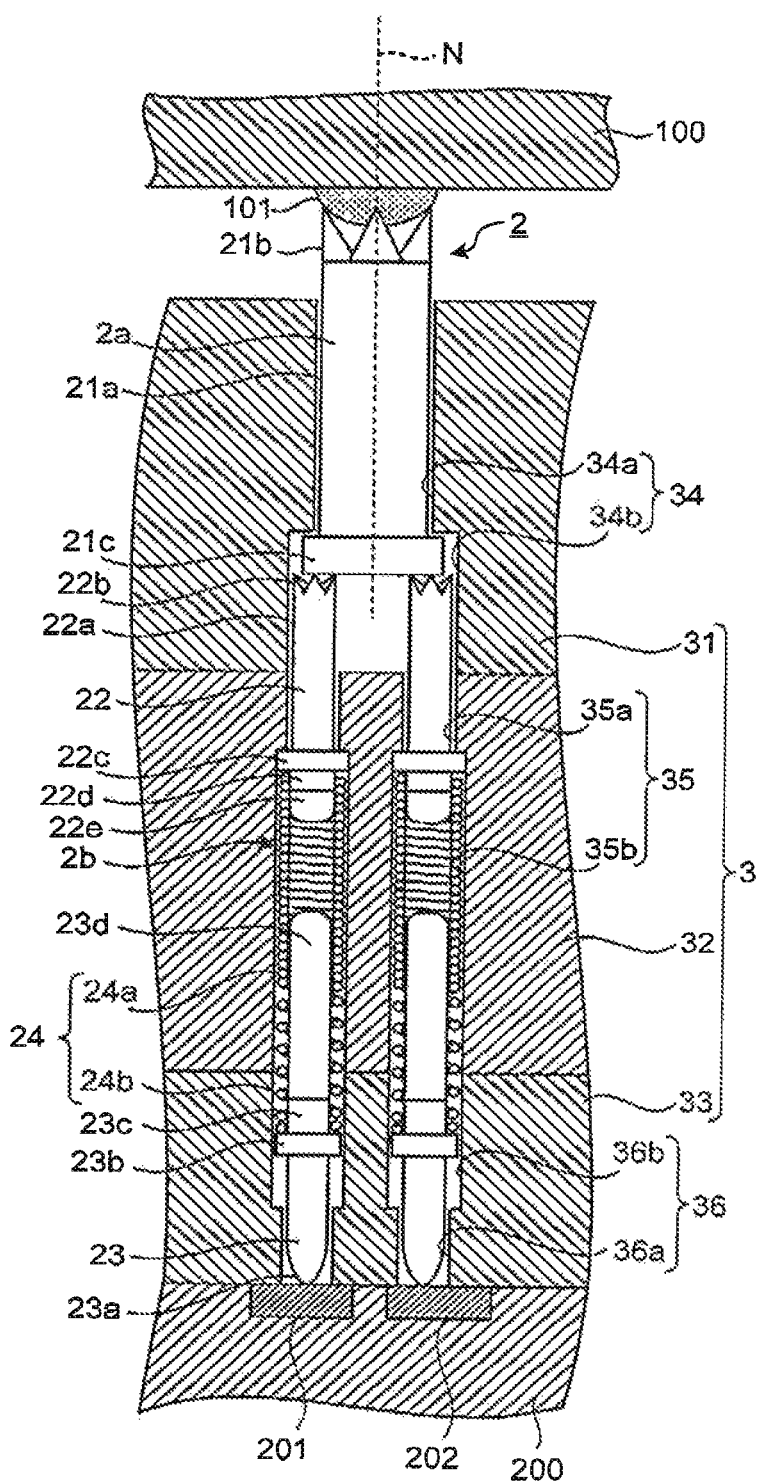
FIG. 3 is a partial cross-sectional diagram illustrating a configuration of the main portion of the contact structure unit according to the first embodiment of the present invention while performing inspection of a semiconductor integrated circuit.

FIG. 3 is a diagram illustrating an inspection-time state of the semiconductor integrated circuit 100 when the contact structure holder 3 is used. At the time of performing inspection of the semiconductor integrated circuit 100, due to the contact load applied from the semiconductor integrated circuit 100, the coil springs 24 are compressed along the longitudinal direction. When the coil springs 24 are compressed, the base end portion 23d of each second plunger 23 enters the corresponding tightly-wound portion 24a and makes sliding contact with the inner peripheral side of the tightly wound portion 24a as illustrated in FIG. 3. At that time, since the axis line of the second plungers 23 does not shake in a major way, the sliding contact between the base end portions 23d and the tightly-wound portions 24a becomes stable. Moreover, since the tightly-wound portions 24a meander in small measure; the contact resistance between the base end portions 23d and the coil springs 24 becomes stable, thereby enabling achieving reliable electrical continuity.

Furthermore, since the leading end of the claw 21b is tapering, even when an oxide film is formed on the surface of a connection electrode 101, the leading end of the claw 21b can cut through the oxide film and make direct contact with the connection electrode 101. The first-type contact-carrying member 2a can be placed in contact with the connection electrode 101 in such a way that a central axis N of the first-type contact-carrying member 2a passes through the center (the center of gravity) of the hemispherical connection electrode 101. Thus, even when the target for contact has a hemispherical shape, it becomes possible to maintain a stable condition of contact.

At that time, the claws 22b of the first plungers 22 are abutting against the side of the flange portion 21c which is different than the side continuing into the contact portion 21a. Herein, the claws 22b are arranged in plurality along the outer edges of the leading end portions 22a, and the apex of any one of the claws 22b makes contact with the flange portion 21c. As a result, without having to regulate the arrangement of the first plungers 22, the claws 22b can be placed in stable contact with the flange portion 21c.

Herein, it is desirable to have four or more claws 21b and four or more claws 22b. Rather, in order to further reliably prevent disengagement from the flange portion 21c, it is more desirable to have six or more claws 22b.

During inspection, signals for inspection provided from the circuit substrate 200 to the semiconductor integrated circuit 100 reach the connection electrode 101 of the semiconductor integrated circuit 100 from electrodes 201 and 202 of the circuit substrate 200 via the second-type contact-carrying member 2b and the first-type contact-carrying member 2a of the contact structure 2. More particularly, the signals for inspection reach the connection electrode 101 of the semiconductor integrated circuit 100 via the second plungers 23, the tightly-wound portions 24a, and the first plungers 22 in the second-type contact-carrying member 2b. In this way, in the contact structure 2, since the first plungers 22 and the second plungers 23 have electrical continuity via the tightly-wound portion 24a, it becomes possible to minimize the conduction path for electrical signals. Hence, during inspection, the signals can be prevented from flowing to the roughly-wound portion 24b; and reduction in inductance can be achieved along with stabilization. Meanwhile, as far as the two electrodes 201 and 202 are concerned, for example, the electrode 201 is a measuring electrode (Sense) and the electrode 202 is an electrical transmission electrode (Force).

According to the first embodiment described above, while performing four-terminal measurement, a first-type contact-carrying member, which makes contact with a plurality of second-type contact-carrying members connected to different electrodes, makes contact in such a way that the axis of the first-type contact-carrying member passes through the center (the center of gravity) of the electrode of a connection electrode (a target for contact). As a result, it becomes possible to achieve reliable electrical continuity with the target for contact.

Meanwhile, due to the downsizing of semiconductor integrated circuits, there are times when the interval (pitch) between the connection electrodes 101 becomes equal to or smaller than 0.15 mm. In that case, the size of the connection electrodes becomes extremely small at about 0.07 mm. As a result, it is becoming difficult to place two typical contact-carrying members in contact with each connection electrode 101. However, in the contact structure according to the first embodiment, since the axis of the first-type contact-carrying member passes through the center of the connection electrode, it becomes possible to deal with the downsizing of the semiconductor integrated circuits.

As described above, by having a four-terminal measurement structure as the contact structure, it becomes possible to ignore the resistance values between the flange portions 21c and the first plungers 22 as well as to ignore the resistance values between the first plungers 22 and the second plungers 23. That is, the contact resistance in the connection electrode 101 and the first-type contact-carrying member 2a as well as the resistance value of the first-type contact-carrying member 2a can be measured without facing any effect of the sliding among the contact-carrying members, thereby enabling implementation of stable electrical determination.

Meanwhile, it is also possible to have tapering boundary wall surfaces between the end portions of the leading end sides of flange portions and the large and smaller diameters of holder holes. As a result, when a contact structures is attached to the holder, the positioning of the first contact-carrying member and the second-type contact-carrying member in the direction perpendicular to the direction of axis can be done in a more reliable manner.

Herein, it is explained that the leading end portion 23a and the flange portion 23b represent a second-type contact-carrying portion. However, if the second-type contact-carrying portion is installed as a part of the contact structure unit 1 illustrated in FIG. 1, then the second-type contact-carrying portion can be configured with only the flange portion 23b and can make contact with an electrode at the leading end portion of the flange portion 23b.

Figure 4:
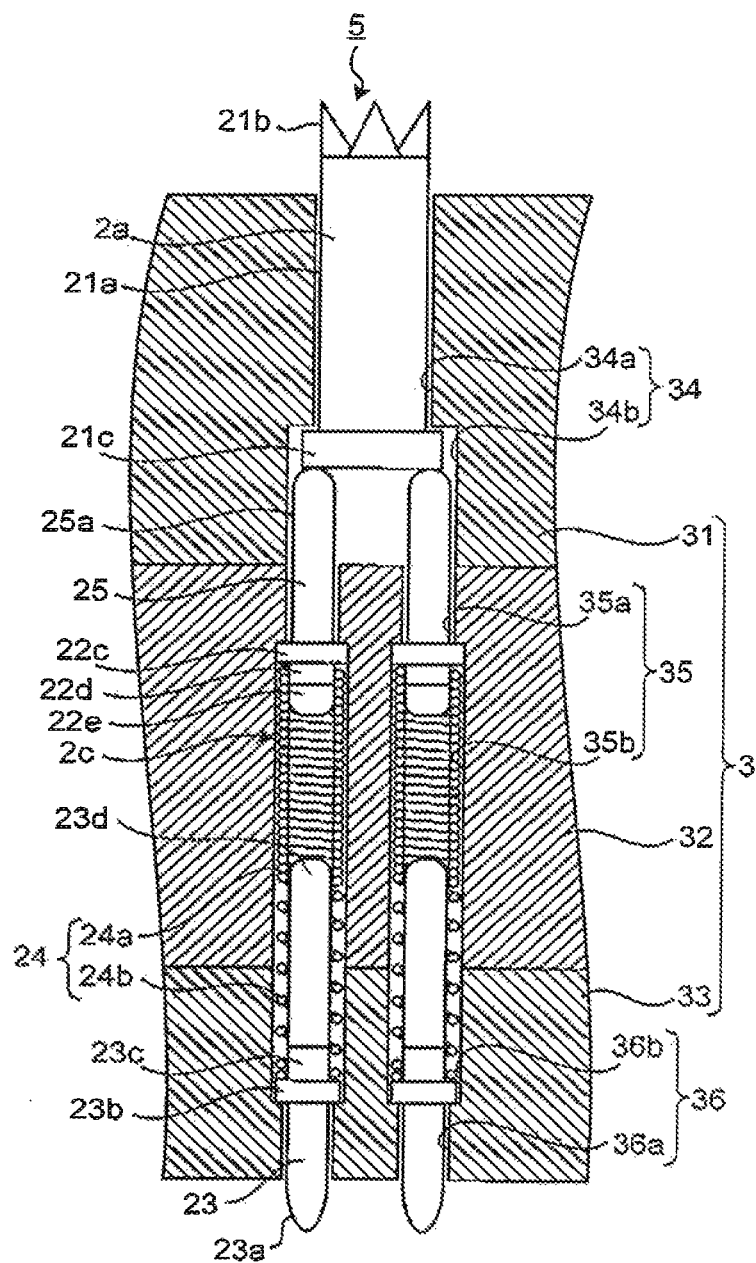
FIG. 4 is a partial cross-sectional diagram illustrating a configuration of the main portion of the contact structure unit according to a first modification example of the first embodiment of the present invention.

FIG. 4 is a partial cross-sectional diagram illustrating a configuration of the main portion of the contact structure unit according to a first modification example of the first embodiment. In the first embodiment described above, the explanation is given for a case in which each leading end portion 22a has a plurality of claws 22b. In contrast, in a contact structure 5 according to the first modification example, in each second-type contact-carrying member 2c, a leading end portion 25a of a first plunger 25 is spindle shaped with a single apex.

Figure 5:
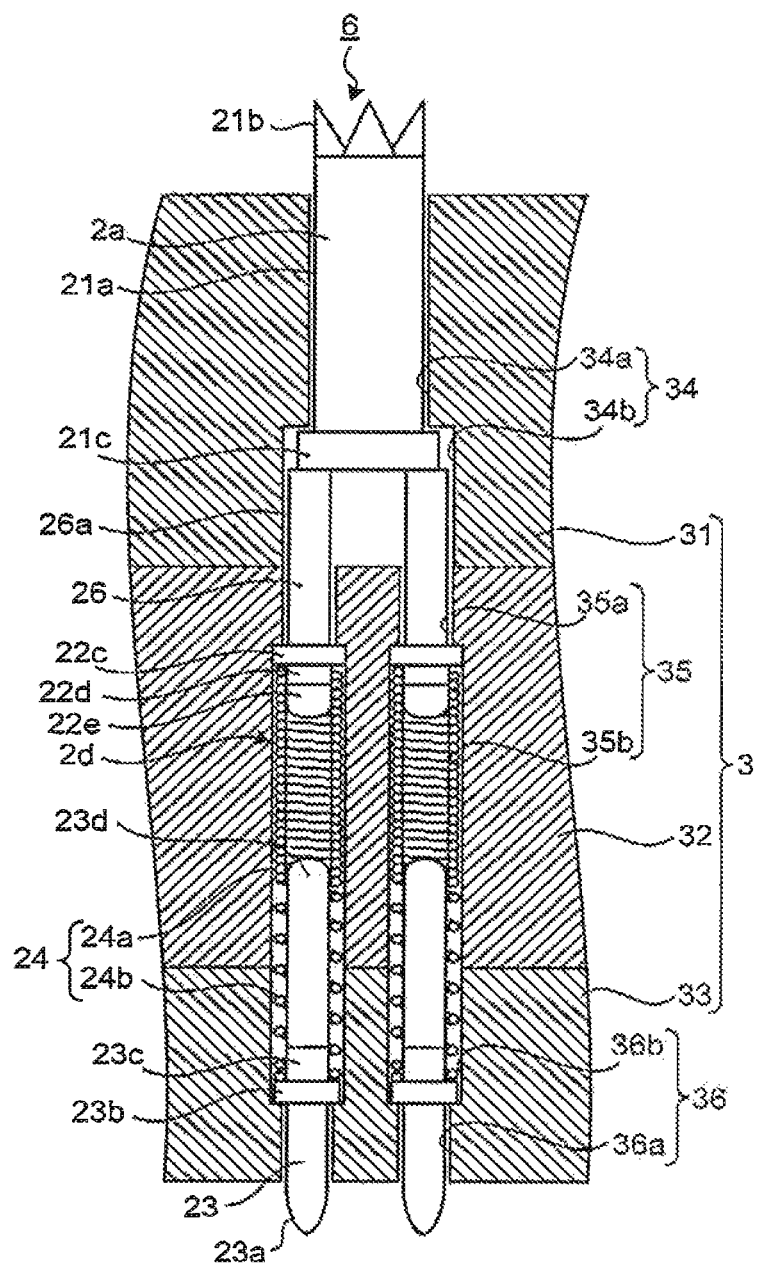
FIG. 5 is a partial cross-sectional diagram illustrating a configuration of the main portion of the contact structure unit according to a second modification example of the first embodiment of the present invention.

FIG. 5 is a partial cross-sectional diagram illustrating a configuration of the main portion of the contact structure unit according to a second modification example of the first embodiment. In the first embodiment described above, the explanation is given for a case in which each leading end portion 22a has a plurality of claws 22b. However, alternatively, as illustrated in a contact structure 6 according to the second modification example, in each second-type contact-carrying member 2d, a leading end portion 26a of a first plunger 26 can have a plane surface with respect to the longitudinal direction of the leading end portion 26a.

Meanwhile, it is explained above that the leading end shape of the contact portion 21a of each first-type contact-carrying member 2a includes the claws 21b. However, alternatively, it is possible to have the leading end shape of the leading end portion 25a according to the first modification example or the leading end portion 26a according to the second modification example.

(Second Embodiment)

Figure 6:
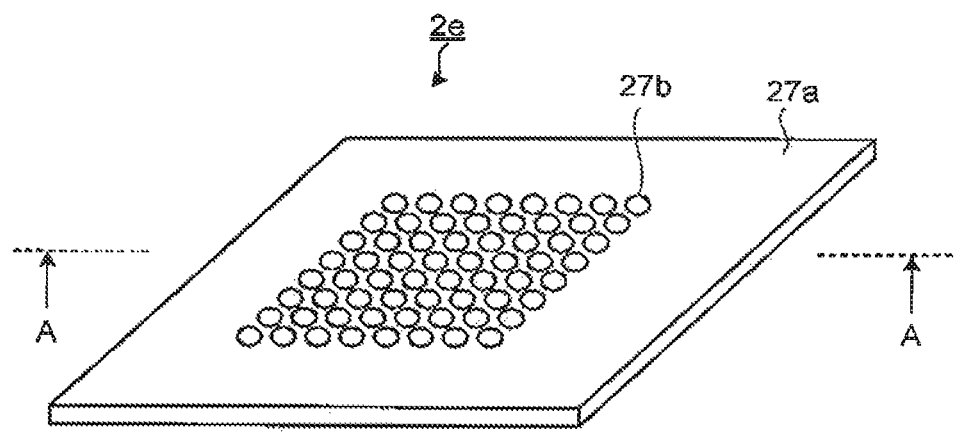
FIG. 6 is a perspective view illustrating a configuration of the main portion of a contact structure unit according to a second embodiment of the present invention.
Figure 7:
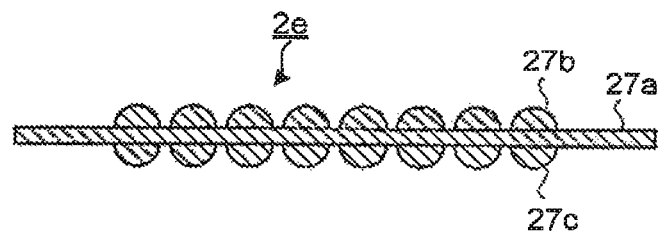
FIG. 7 is a cross-sectional diagram of a cross-section along A-A line illustrated in FIG. 6.
Figure 8:
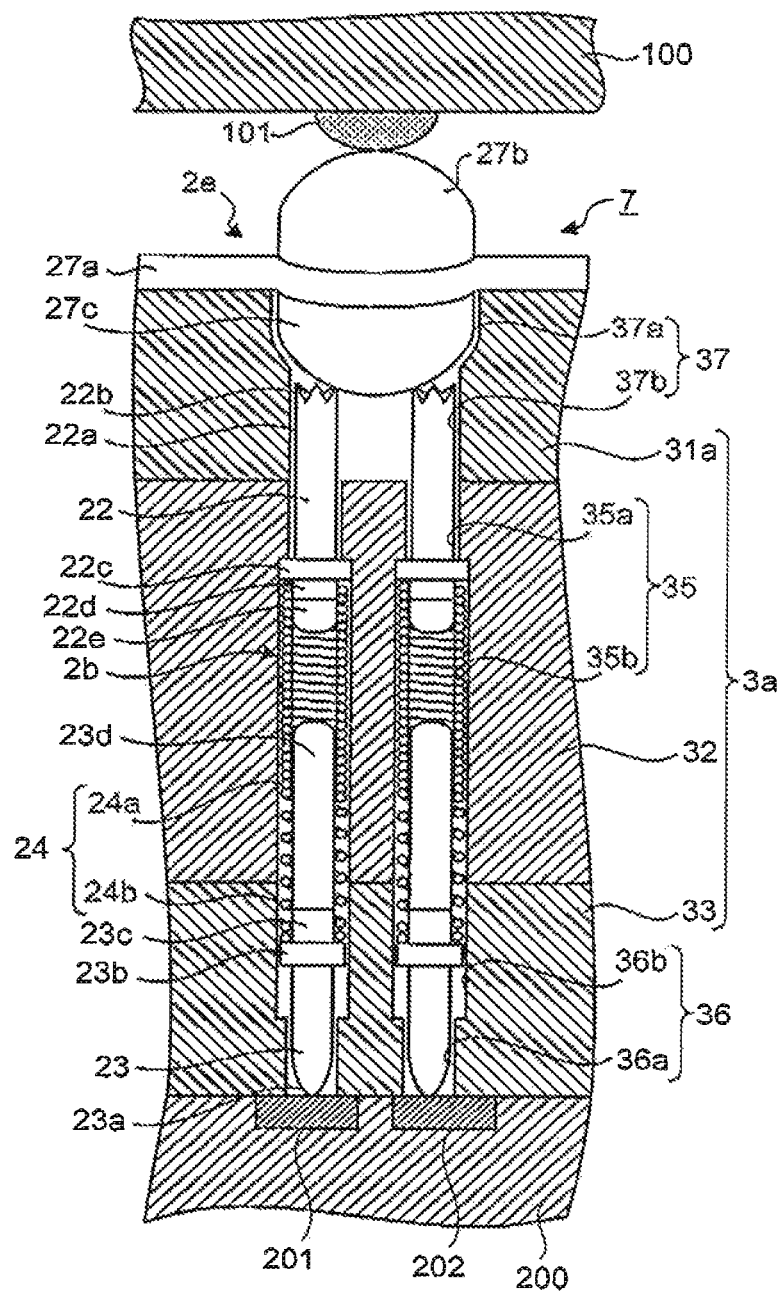
FIG. 8 is a partial cross-sectional diagram illustrating a configuration of the main portion of the contact structure unit according to the second embodiment of the present invention while performing inspection of a semiconductor integrated circuit.

FIG. 6 is a perspective view illustrating a configuration of the main portion of a contact structure unit according to a second embodiment. FIG. 7 is a cross-sectional diagram of a cross-section along A-A line illustrated in FIG. 6. FIG. 8 is a diagram illustrating an inspection-time state of the semiconductor integrated circuit 100 in which a contact structure holder 3a is used. Herein, the constituent elements identical to the constituent elements of the contact structure unit 1 illustrated in FIG. 1 are referred to by the same reference numerals. In the second embodiment, the electrical continuity between the semiconductor integrated circuit 100 and the circuit substrate 200 is achieved using a sheet-like first-type contact-carrying member 2e in place of the first-type contact-carrying members 2a.

As illustrated in FIGS. 6 and 7, the first-type contact-carrying member 2e includes a sheet portion 27a that is elastically deformable and insulating in nature; includes a plurality of electrode-side contact portions 27b (first-type contact portions) that is disposed on the sheet portion 27a corresponding to the arrangement of the connection electrodes 101 of the semiconductor integrated circuit 100; and includes a contact-structure-side contact portion 27c (a third-type contact portion) that is disposed corresponding to the electrode-side contact portions 27b on the surface on the opposite side of the side on which the electrode-side contact portions 27b of the sheet portion 27a are formed. Herein, the contact-structure-side contact portion 27c corresponding to the electrode-side contact portions 27b is formed using an electrically-conductive material and is electrically connected via the sheet portion 27a.

As illustrated in FIG. 8, the first-type contact-carrying member 2e is held by the contact structure holder 3a in a state in which the electrode-side contact portions 27b are oriented outward and the contact-structure-side contact portion 27c is oriented toward the inside of the contact structure holder 3a. Herein, the contact structure holder 3a is made by laminating a first member 31a, which holds the first-type contact-carrying member 2e, and the abovementioned second member 32 and the third member 33 that hold the second-type contact-carrying members 2b. In the first member 31a is formed a holder hole 37 that functions as a holding unit for housing and holding some portion of a plurality of first-type contact-carrying members 2e and a plurality of second-type contact-carrying members 2b. Moreover, the holder holes 35, 36, and 37 are formed to have mutually parallel axis lines. The position of forming the holder hole 37 is determined according to the wiring pattern of the semiconductor integrated circuit 100.

The holder hole 37 is made of a first holder hole 37a, which has the opening at the top end face of the contact structure holder 3a, and a second holder hole 37b, which is communicated with the first holder hole 37a and which is formed with a diameter corresponding to the distance between a pair of small diameter portions 35a in the contact structure holder 3a that correspond to the contact structure 2. The first holder hole 37a forms a substantially hemispherical space that, in the lamination direction of the first member 31a of the contact structure holder 3a, has the length (depth) greater than the length of protrusion of the contact-structure-side contact portion 27c from the sheet portion 27a.

During inspection of the semiconductor integrated circuit 100, as illustrated in FIG. 8, due to the contact load applied from the semiconductor integrated circuit 100, the sheet portion 27a undergoes elastic deformation in the direction in which the load is applied. Once the sheet portion 27a undergoes deformation, the contact-structure-side contact portion 27c presses the first plunger 22 according to the load caused by the deformation. The base end portion 23d of the second plunger 23 enters the tightly-wound portion 24a and makes sliding contact with the inner peripheral side of the tightly wound portion 24a.

At that time, during inspection, signals for inspection provided from the circuit substrate 200 to the semiconductor integrated circuit 100 reach the connection electrode 101 of the semiconductor integrated circuit 100 from the electrode 201 of the circuit substrate 200 via the second plungers 23, the tightly-wound portion 24a, the first plungers 22, the contact-structure-side contact portion 27c, and the electrode-side contact portions 27b.

According to the second embodiment described above, in an identical manner to the first embodiment, while performing four-terminal measurement, a first-type contact-carrying member, which makes contact with a plurality of second-type contact-carrying members connected to different electrodes, makes contact in such a way that the axis of the first-type contact-carrying member passes through the center (the center of gravity) of the electrode of a connection electrode (a target for contact). As a result, it becomes possible to achieve reliable electrical continuity with the target for contact.

Moreover, since the contact structure unit can be created by mounting a sheet-like first-type contact-carrying member on the contact structure holder, reliable electrical continuity with the target for contact can be achieved with a simpler configuration.

In an identical manner to the first embodiment, by having the abovementioned contact structure as a four-terminal measurement structure, it becomes possible to ignore the resistance values between the contact-structure-side contact portion 27c and the first plungers 22 with reference to FIG. 8 as well as to ignore the resistance values between the first plungers 22 and the second plungers 23. That is, the contact resistance in the connection electrode 101 and the first-type contact-carrying member 2e as well as the resistance value of the first-type contact-carrying member 2e can be measured without facing any effect of the sliding among the contact-carrying members, thereby enabling implementation of stable electrical determination.

Meanwhile, in the second embodiment described above, it is explained that the electrode-side contact portions 27b are hemispherical. However, alternatively, as described in the first embodiment, the electrode-side contact portions 27b can have the same shape as the contact portion 21a which includes the claws 21b.

(Third Embodiment)

Figure 9:
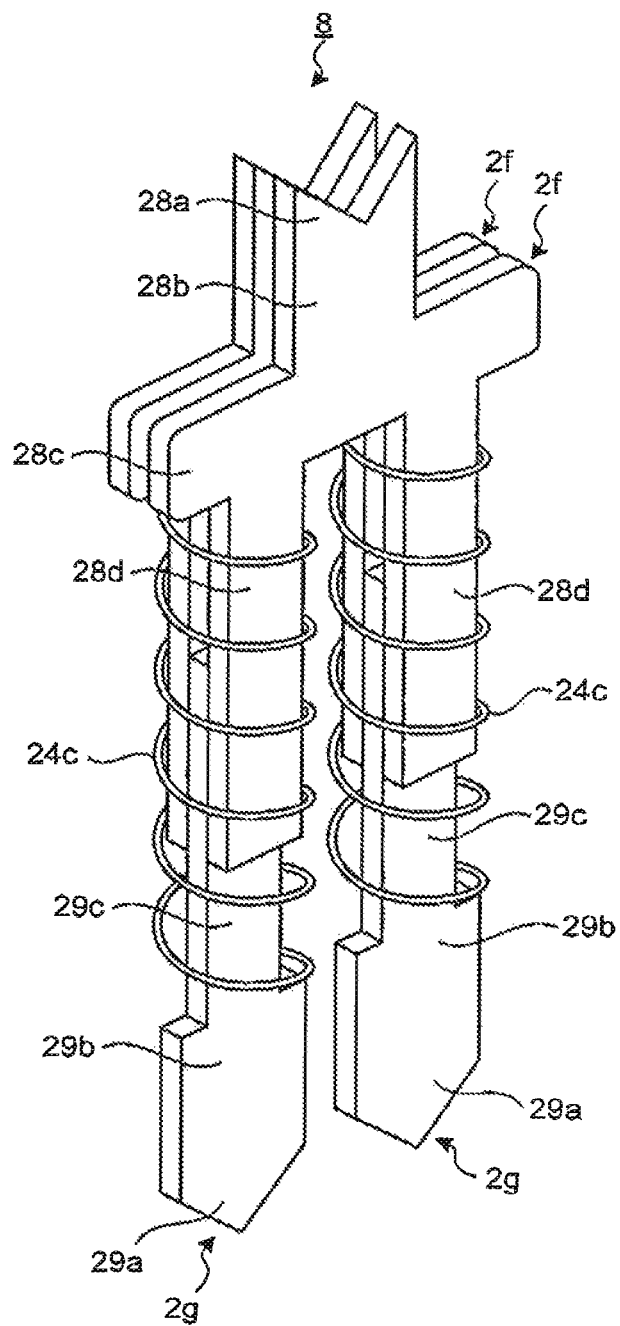
FIG. 9 is a perspective view illustrating a configuration of a contact structure of a contact structure unit according to a third embodiment of the present invention.
Figure 10:
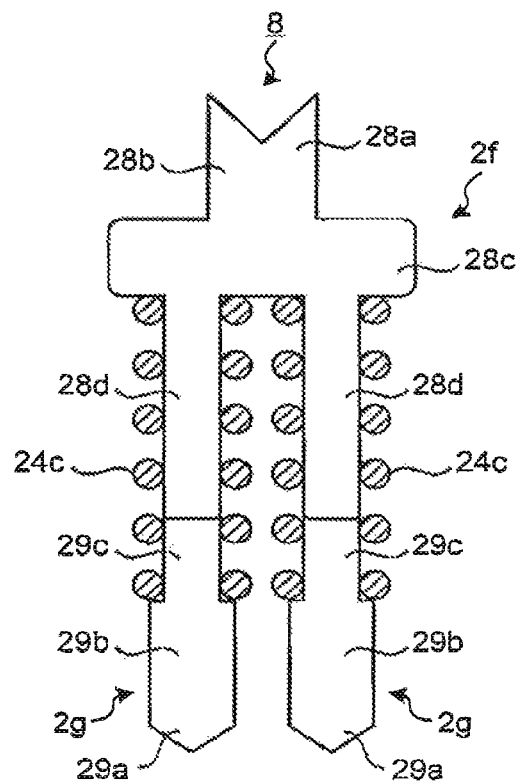
FIG. 10 is a front view illustrating a configuration of the contact structure according to the third embodiment of the present invention.
Figure 11:
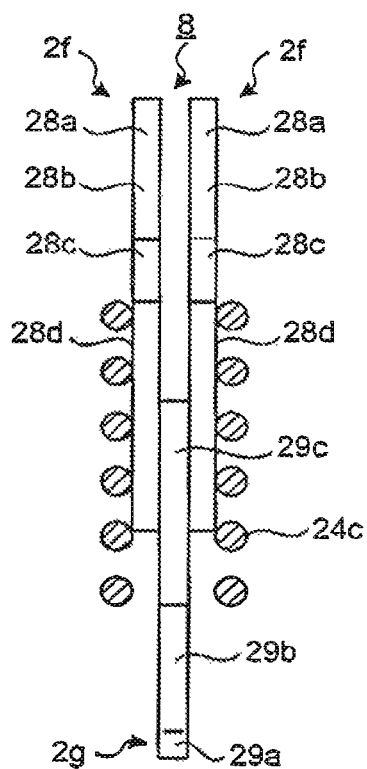
FIG. 11 is a side view illustrating the configuration of the contact structure according to the third embodiment of the present invention.

FIG. 9 is a perspective view illustrating a configuration of a contact structure of a contact structure unit according to a third embodiment. FIG. 10 is a front view illustrating a configuration of the contact structure according to the third embodiment. FIG. 11 is a side view illustrating the configuration of the contact structure according to the third embodiment. A contact structure 8 illustrated in FIGS. 9 to 11 is formed using an electrically-conductive material. The contact structure 8 includes two first-type contact-carrying members 2f that, during inspection of the semiconductor integrated circuit 100 illustrated in FIG. 1, form a plate which makes contact with the connection electrode 101 of the semiconductor integrated circuit 100; includes two plate-like second-type contact-carrying members 2g making contact with the first-type contact-carrying members 2f and each making contact with one electrode of the circuit substrate 200 illustrated in FIG. 1; and includes coil springs 24c that constrain the first-type contact-carrying members 2f and the second-type contact-carrying members 2g in a slidable manner.

Each first-type contact-carrying member 2f includes a plate-like leading end portion 28b (a first-type contact portion) that has a plurality of claws 28a with a tapering leading ends; includes a flange portion 28c that is disposed at the base end side of the leading end portion 28b and that has a greater width than the leading end portion 28b; and includes two base end portions 28d that extend from the end portion of the flange portion 28c which is different than the side linked to the leading end portion 28b and that are inserted in the inner peripheral side of the coil springs 24c. Moreover, in the flange portion 28c, the base end portions 28d are formed on the inner side than the end portion in the width direction of the flange portion 28c.

Each second-type contact-carrying member 2g includes a plate-like leading end portion 29b (a second-type contact portion) that has a vertex 29a with a tapering leading end; and includes a base end portion 29c that extends from the base end side of the leading end portion 29b for a width smaller than the leading end portion 29b and that is inserted on the inner peripheral side of the coil springs 24c and makes contact with the base end portion 28d. Moreover, the base end portion 29c has the same width as the width of the base end portion 28d of the first-type contact-carrying member 2f.

When the contact structure 8 makes contact with the semiconductor integrated circuit 100, the coil springs 24c elongate and compress in the direction of axis so as to cushion the impact of the semiconductor integrated circuit 100 against the connection electrodes as well as to apply load on the semiconductor integrated circuit 100 and the circuit substrate 200. Herein, the coil springs 24c are wound at an inner diameter equivalent to the diameter of the base end portion 28d and wound at a predetermined pitch.

In the contact structure 8, in the state when the leading end portions 28b and 29b are oriented in opposite directions, the base end portions 28d of the two first-type contact-carrying members 2f sandwich and make contact with the base end portions 29c of the second-type contact-carrying members 2g. As a result, electrical continuity is achieved between the first-type contact-carrying members 2f and the second-type contact-carrying members 2g. At that time, the condition of contact between the contact-carrying members is maintained because the coil springs 24c constrain the base end portions 28d and 29c in a slidable manner as illustrated in FIGS. 9 to 11. The coil springs 24c abut against a stepped portion formed by the flange portion 28c and the base end portion 28d as well as a stepped portion formed by the leading end portion 29b and the base end portion 29c, and bias the first-type contact-carrying members 2f and the second-type contact-carrying members 2g toward the respective leading end portions. Meanwhile, because of the claws 28a of the two first-type contact-carrying members 2f, the contact structure 8 has the leading end with four apices. As a result, in the contact structure 8, each apex makes contact with the hemispherical connection electrode 101. Hence, it becomes possible to maintain a stable condition of contact.

According to the third embodiment described above, in an identical manner to the first embodiment, while performing four-terminal measurement, a first-type contact-carrying member, which makes contact with a plurality of second-type contact-carrying members connected to different electrodes, makes contact in such a way that the axis of the first-type contact-carrying member passes through the center (the center of gravity) of the electrode of a connection electrode (a target for contact). As a result, it becomes possible to achieve reliable electrical continuity with the target for contact.

Moreover, since the contact structure can be formed by laminating plate-like members, reliable electrical continuity with the target for contact can be achieved with a simpler configuration.

In an identical manner to the first embodiment, by having the abovementioned contact structure as a four-terminal measurement structure, it becomes possible to ignore the resistance values between the base end portion 28d and the base end portion 29c. That is, the contact resistance in the connection electrode 101 and the first-type contact-carrying member 2f as well as the resistance value of the first-type contact-carrying member 2f can be measured without facing any effect of the sliding among the contact-carrying members, thereby enabling implementation of stable electrical determination.

Figure 12:
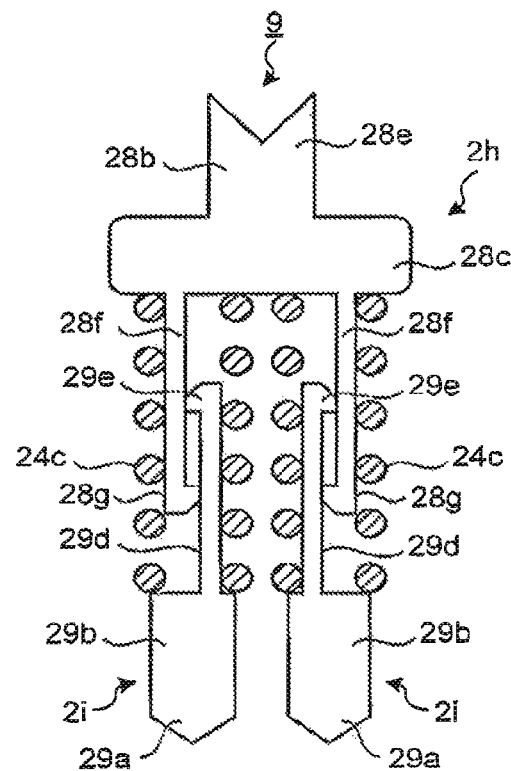
FIG. 12 is a front view of a configuration of a contact structure according to a modification example of the third embodiment of the present invention.
Figure 13:
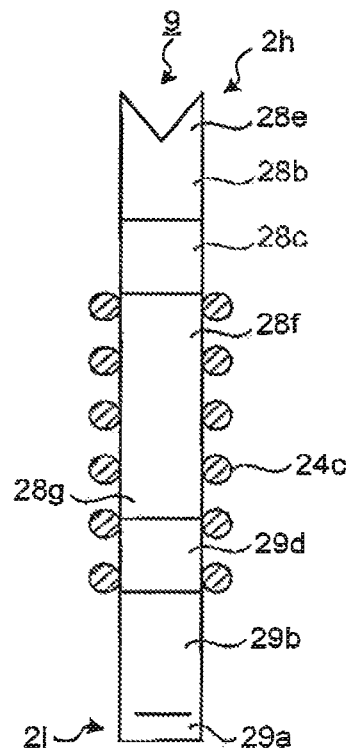
FIG. 13 is a side view illustrating the configuration of the contact structure according to the modification example of the third embodiment of the present invention.

FIG. 12 is a front view of a configuration of a contact structure according to a modification example of the third embodiment. FIG. 13 is a side view illustrating the configuration of the contact structure according to the modification example of the third embodiment. A contact structure 9 according to the modification example includes a first-type contact-carrying member 2h that, during inspection of the semiconductor integrated circuit 100 illustrated in FIG. 1, forms a plate which makes contact with the connection electrode 101 of the semiconductor integrated circuit 100; two plate-like second-type contact-carrying members 2i making contact with the first-type contact-carrying member 2h and each making contact with one electrode of the circuit substrate 200 illustrated in FIG. 1; and the coil springs 24c that constrain the first-type contact-carrying members 2h and the second-type contact-carrying members 2i in a state of slidable contact.

The first-type contact-carrying member 2h includes the leading end portion 28b (a first-type contact portion) that has a plurality of (in the third embodiment, four) claws 28e with a tapering leading end; the flange portion 28c that is disposed at the base end side of the leading end portion 28b and that has a greater width than the leading end portion 28b; and two base end portions 28f that extend from the end portion of the flange portion 28c which is different than the side linked to the leading end portion 28b and that are inserted in the inner peripheral side of the coil springs 24c. Moreover, in the flange portion 28c, each base end portion 28f is formed on the inner side of the end portion in the direction in which the flange portion 28c extends. Furthermore, each base end portion 28f has a protrusion 28g that is formed at the end portion of a side different than the side linked to the flange portion 28c and that protrudes in a direction perpendicular to the direction in which the corresponding base end portion 28f extends.

Each second-type contact-carrying member 2i has the same thickness as the thickness of the first-type contact-carrying member 2h, and includes the leading end portion 29b (a second-type contact portion) that includes the vertex 29a with a tapering leading end; and includes a base end portion 29d that extends from the base end side of the leading end portion 29b for a width smaller than the leading end portion 29b and that is inserted on the inner peripheral side of the coil springs 24c and makes contact with the base end portion 28f. Moreover, each base end portion 29d has a protrusion 29e that is formed at the end portion on a side different than the side linked to the base end portion 29d and that protrudes in a direction perpendicular to the direction in which the corresponding base end portion 29d extends.

In the contact structure 9, in the state when the leading end portions 28b and 29b are oriented in opposite directions, the base end portions 28f of the first-type contact-carrying member 2h make contact with the base end portions 29d of the second-type contact-carrying members 2i while facing each other in the through-thickness direction. As a result, electrical continuity is achieved between the first-type contact-carrying member 2h and the second-type contact-carrying members 2i. At that time, the condition of contact between the contact-carrying members is maintained because the coil springs 24c constrain the base end portions 28f and 29d in a slidable manner as illustrated in FIGS. 12 and 13. The coil springs 24c abut against a stepped portion formed by the flange portion 28c and the base end portion 28f as well as a stepped portion formed by the leading end portion 29b and the base end portion 29d, and bias the first-type contact-carrying member 2h and the second-type contact-carrying members 2i toward the leading end portions 28b and 29b, respectively. Moreover, in the contact structure 9, once biasing toward the leading end portions 28b and 29b is done by the coil springs 24c, the protrusions 28g and the protrusions 29e engage with each other. As a result of the mutual engagement between the protrusions 28g and the protrusions 29e in the contact structure 9, it becomes possible to prevent a situation in which the first-type contact-carrying member 2h and the second-type contact-carrying members 2i come off due to the biasing force of the coil springs 24c.

Meanwhile, in the modification example described above, it is explained that the protrusions 28g and 29e are parallel to the plate surface and protrude in a direction perpendicular to the directions in which the base end portions 28f and 29d, respectively, extend. However, alternatively, it is also possible to have a case in which the protrusions 28g and 29e are perpendicular to the plate surface and protrude in a direction perpendicular to the directions in which the base end portions 28f and 29d, respectively, extend.

Moreover, it is explained above that the leading end shape of the leading end portion 28b of the first-type contact-carrying member 2h includes the claws 28e. However, alternatively, it is possible to have the leading end shape of the leading end portion 25a according to the first modification example or the leading end portion 26a according to the second modification example.

INDUSTRIAL APPLICABILITY

In this way, a contact structure unit according to the present invention is useful in achieving reliable electrical continuity with a target for contact.

REFERENCE SIGNS LIST 1 contact structure unit
2, 5, 6, 7, 8, 9 contact structure
2a, 2e, 2f, 2h first-type contact-carrying member
2b, 2c, 2d, 2g, 2i second-type contact-carrying member
3, 3a contact structure holder
4 holder member
21a contact portion
21b, 22b, 28a claw
21c, 22c, 23b, 28c flange portion
22a, 23a, 25a, 26a, 28b, 29b leading end portion
22, 25, 26 first plunger
22d, 23c boss portion
22e, 23d, 28d, 29c base end portion
23 second plunger
24, 24c coil spring
24a tightly-wound portion
24b roughly-wound portion
27a sheet portion
27b electrode-side contact portion
27c contact-structure-side contact portion
29a vertex
31, 31a first member
32 second member
33 third member
34, 35, 36, 37 holder hole
34a, 35a, 36a small diameter portion
34b, 35b, 36b large diameter portion
37a first holder hole
37b second holder hole
100 semiconductor integrated circuit
200 circuit substrate

The invention claimed is:

1. A contact structure unit that achieves electrical continuity between a substrate, which includes a plurality of electrodes, and a contact object that outputs signals for inspection to the substrate, the contact structure unit comprising:
a first-type contact-carrying member that includes a flange portion at one end and a first-type contact portion opposite the flange portion, for making contact with the contact object;
a plurality of second-type contact-carrying members, each second-type contact-carrying member including:
a first end portion as a second-type contact portion configured to make contact with one of the electrodes different from another electrode at another first end portion as a second-type contact portion of another second-type contact-carrying member,
wherein each of the second-type contact-carrying member includes
an electrically-conductive first plunger that has a tapering leading end and that has a leading end portion making contact with the first-type contact-carrying member; and
an electrically-conductive second plunger that includes the second-type contact portion; and
a second end portion configured to make contact with the flange portion of the first-type contact-carrying member; and
a plurality of coil springs each of which links the first plunger and the second plunger and is disposed between the first-type contact portion and each of the second-type contact portions so as to bias the first contact portion and each of the second-type contact portions.

2. The contact structure unit according to claim 1, wherein the leading end portion includes a plurality of claws.

3. The contact structure unit according to claim 1, wherein the first-type contact portion includes a plurality of claws.

4. The contact structure unit according to claim 2, wherein the first-type contact portion includes a plurality of claws.

* * * * *